United States Patent [19]
Fujieda

[11] Patent Number: 5,390,192
[45] Date of Patent: Feb. 14, 1995

[54] HIGH-SPEED PATTERN GENERATOR

[75] Inventor: Takanori Fujieda, Tokyo, Japan

[73] Assignee: Ando Electric Co., Ltd., Tokyo, Japan

[21] Appl. No.: 801,308

[22] Filed: Dec. 2, 1991

[30] Foreign Application Priority Data

Dec. 10, 1990 [JP] Japan .................. 2-407196

[51] Int. Cl.⁶ .................. G01R 31/28; G06F 11/00
[52] U.S. Cl. ......................... 371/27; 364/948.1
[58] Field of Search .......... 371/27, 11.2, 22.3, 371/22.4, 22.6, 25.1, 15.1, 22.1, 21.6, 43, 37.1, 61, 62, 29.1, 16.5; 395/550, 800, 275; 364/917.3, 921.8, 942.7, 948.1, 965.6

[56] References Cited

U.S. PATENT DOCUMENTS

| 4,293,950 | 10/1981 | Shimizu et al. | 371/27 |
|---|---|---|---|
| 4,313,200 | 1/1982 | Nishiura | 371/25.1 |
| 4,389,723 | 6/1983 | Nigorikawa et al. | 371/27 |
| 4,402,081 | 8/1983 | Ichimiya et al. | 371/27 |
| 4,555,663 | 11/1985 | Shimizu | 371/27 |
| 4,788,684 | 11/1988 | Kawaguchi et al. | 371/27 |
| 4,797,886 | 1/1989 | Imada | 371/27 |
| 4,876,685 | 10/1989 | Rich | 371/21.5 |
| 4,905,183 | 2/1990 | Kawaguchi et al. | 371/27 |

Primary Examiner—Charles E. Atkinson
Assistant Examiner—Dieu-Minh Le
Attorney, Agent, or Firm—Seidel, Gonda, Lavorgna & Monaco

[57] ABSTRACT

A high speed pattern generator includes a programmable counter, n pattern generating circuits, a multiplexer and a control memory. The programmable counter divides a frequency of a system clock signal by n ($n \geq 2$) to thereby generate a clock signal having a frequency of 1/n of the frequency of the system clock and a select signal representative of a count output of said programmable counter. The n pattern generating circuits operate at a frequency determined by the clock signal and produce a pattern signal as a function. A multiplexer converts patterns generated by the n pattern generating circuits into a time-serial pattern in response to the select signal for sequentially selecting outputs of the n pattern generating circuits to thereby output a fast pattern. A control memory which operates at a frequency determined by the clock signal produces a control signal to periodically switch a frequency division ratio of the programmable counter between a plurality of ratios. When the frequency division ratio is changed, generation of any dummy pattern can be suppressed.

3 Claims, 4 Drawing Sheets

HIGH-SPEED PATTERN GENERATOR

BACKGROUND OF THE INVENTION

1. Field of the Invention

The present invention relates generally to a high-speed pattern generator. More particularly, the invention is concerned with a high-speed pattern generator which is used For testing IC devices and which includes n pattern generating circuits (n is an integer not smaller than 2) adapted to operate in parallel for generating a time-serial pattern such as an address pattern at n times as high a frequency as that of input through time-division multiplexing without generating any dummy pattern.

2. Description of the Related Art

As the pattern generator employed for testing a memory device, a typical one of IC devices, there is known a pattern generator referred to as the algorithmic pattern generator which is so arranged as to generate an address pattern through repetitive arithmetic operations.

FIG. 6 of the accompanying drawings shows an address pattern generating circuit known heretofore. In the figure, a reference numeral 21 denotes a register, 22 denotes an arithmetic and logic unit (hereinafter referred to as ALU), 23 denotes a selector; and numerals 24 and 25 denote registers, respectively. The register 21 is adapted for storing the result of arithmetic operation performed by the ALU 22, which result is outputted as a pattern output 28 and at the same time fed back to the selector 23. The register 24 is used for storing an addend and having an output connected to an input terminal B of the ALU 22. The register 25 is used for storing an initial value and has an output connected to one input of the selector 23 which is designed to select either the output of the register 21 or that of the register 25 in response to a select signal 27. The output of the selector 23 is supplied to the other input A of the ALU 22 which performs arithmetic operation on the input values A and B under the command of an operation command signal 26.

FIG. 7 of the accompanying drawings is a view for illustrating an incrementing address pattern generating operation of the address generating circuit shown in FIG. 6. For generation of a first pattern value, an initial value "0" placed in the register 25 is selected by the selector 23 to be applied to the input A of the ALU 22 which is set to an A-pass mode by the operation command signal 26. Thus, the value "0" is outputted from the ALU 22 without undergoing any operation and loaded in the register 21.

Upon generation of a second pattern value, the output "0" of the register 21 is selected by the selector 23 and applied to the input A of the ALU 22 which then add together the value "0" at the input A and an addend "1" applied to the input B from the register 24, as a result of which a value "1" is loaded in the register 21.

For generation of a third pattern value, a value "1" placed in the register 21 is added with a value "1" stored in the register 24, resulting in generation of "2" from the output of the ALU 22, which value is loaded in the register 21. Similar arithmetic operations are repetitively executed until the value load in the register 21 assumes "n".

FIG. 8 shows a circuit configuration of a high-speed pattern generator known heretofore. In the figure, reference numeral 2 denotes n pattern generating circuits each implemented in the structure shown in FIG. 7, a numeral 3 denotes a multiplexer (MUX), 4 denotes a control memory and 6 denotes a frequency divider.

Referring to FIG. 8, a clock signal 11 (having a frequency f and representing a speed or rate at which a desired pattern is to be generated is inputted to the frequency divider 6 from a system clock (not shown). The frequency divider 6 generates a clock 12 having a divided frequency of f/n (where n represents the number of the pulse generating circuits 2) and a select signal 13 which is supplied to the multiplexer 3. Thus, each of the n pattern generating circuits 2 operates at a frequency of f/n, wherein the pattern outputs of the n pattern generating circuits 2 are multiplexed by the multiplexer 3 on a time-division basis in response to the select signal 13, resulting in that an output pattern 15 is produced at a frequency f from the output of the multiplexer 3.

Figures 9, 10, 11:
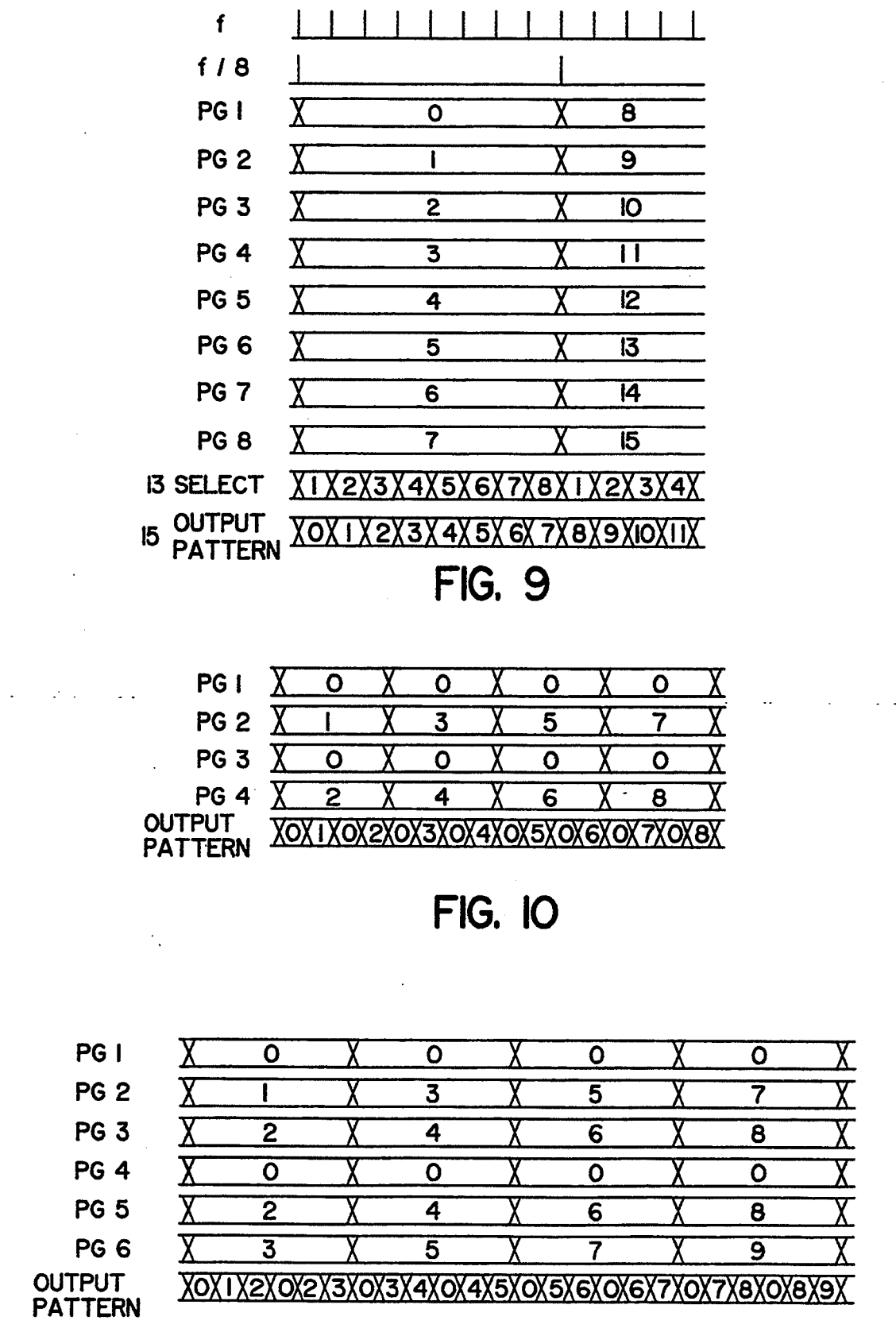

FIG. 9 shows, by way of example, a pattern generating operation of the pattern generator shown in FIG. 8 on the assumption that eight pattern generating circuits 2 are provided (i.e. n=8). In a first cycle, each of the pattern generating circuits 2 generates an address pattern of "0" to "7" at a frequency of f/8. The outputs of the pattern generating circuits 2 are so selected by the multiplexer 3 that the input pattern values "0" to "7" are outputted time-serially at a rate corresponding to the frequency f.

In a second cycle, the pattern generating circuits 2 generates pattern values of "8" to "15", respectively, at a frequency of f/8, whereby a pattern including address values "8" to "15" is outputted at a rate corresponding to the frequency f. A feature of the pattern generator under consideration can be seen in that in the case of the incrementing address pattern illustrated in FIG. 8, the pattern generating circuits 2 generate pattern valuess of the addresses each incremented by eight on a cycle basis. Accordingly, when twelve pattern generating circuits 2 are connected in parallel in the same arrangement as shown in FIG. 8, a series of twelve address values are incremented by 12 on a cycle-by-cycle basis by the pattern generating circuits 2.

With the structure of the pattern generator shown in FIG. 8, it is possible to generate a pattern of a greater length with a smaller number of initial values and addends because the pattern changes only by a constant value from one to another cycle throughout the first to n-th cycle at a constant frequency. In this conjunction, it is noted that the number of addresses of a general-purpose random access memory (RAM) is given by 2m where m represents an integer. Accordingly, for testing such RAM, the number of the pattern generating circuits 2 connected to operate in parallel can be selected to be 2m (2, 4, 8 and so forth). In that case, each of the pattern generating circuits 2 may repeat addition of a constant value without being accompanied with generation of a dummy pattern due to a residuum.

In FIG. 10 of the accompanying drawings, there is illustrated an address pattern referred to as ping-pong pattern. In this pattern, repetition base is two. Accordingly, by providing the pattern generating circuits 2 in parallel in a number of 2m ( 2, 4, 6, 8, ... ), change or incrementation of the value in each of the pattern generating circuits 2 can be made constant.

FIG. 11 is a view for illustrating what is called a galloping address pattern. In this address pattern, the repetition base is three. Accordingly, it is necessary to provide in parallel the pattern generating circuits 2 in a number of 3m (3, 6, 9, ...) in order that each of the pattern generating circuits 2 is allowed to change or increment the respective address value only by a constant value. At this juncture, it is to be mentioned that there are two types of galloping patterns, one having the repetition base of three and the other in which the address is incremented from the first to the last one by one. Generation of a dummy pattern presents a problem because it differs from the desired pattern. Accordingly, in order to inhibit the dummy pattern from being generated, it is required to change over the number of the pattern generating circuits between 2m and 3m. However, in the hitherto known address pattern generator, the number of the pattern generating circuits operated in parallel is fixed with the frequency division ratio being also fixed.

SUMMARY OF THE INVENTION

It is therefore an object off the present invention to provide a fast pattern generator which is capable of generating a desired pattern without being accompanied with generation of any dummy pattern.

To this end, It is taught according to the concept of the invention to change over on a real time basis the frequency division ratio of the frequency divider correspondingly (e.g. between eight and six) when the number of the pattern generating circuits operating in parallel is to be changed over on a real time (e.g. between eight and six) as in the case of the galloping pattern.

In view of the above and other objects which will become apparent as description proceeds, there is provided according to a first aspect of the invention a high-speed pattern generator which comprises a programmable counter for dividing a frequency of a system clock signal by n (where n represents an integer not smaller than 2) to thereby generate a clock signal and a select signal, n pattern generating circuits each operating at a frequency determined by the clock signal, a multiplexer (3) for converting patterns generated by the n pattern generating circuits (2) into a time-serial pattern under the control of the select signal to thereby output a pattern at a high frequency or speed, and a control memory which operates at a frequency determined by the clock signal for producing a control signal for controlling a frequency division ratio of the programmable counter.

According to a second aspect of the invention, there is provided a high-speed pattern generator which comprises a programmable counter for dividing a frequency of a system clock signal by n (where n represents an integer not smaller than 2) to thereby generate a clock signal and a select signal, n pattern generating circuits (2) each operating at a frequency determined by the clock signal, a shift register for converting patterns generated by the n pattern generating circuits into a time-serial pattern to thereby output a synthesized pattern at a high frequency, and a control memory which operates at a frequency determined by the clock signal for producing a control signal to control a frequency division ratio of the programmable counter.

These and other advantages and attainments of the present invention will become apparent to those skilled in the art upon a reading of the following detailed description when taken in conjunction with the drawings.

BRIEF DESCRIPTION OF THE DRAWINGS

FIG. 9 is a chart for illustrating, by way of example, a pattern generating operation of the pattern generator shown in FIG. 8;

FIG. 10 is a view for illustrating an address pattern referred to as a ping-pong pattern; and FIG. 11 is a view for illustrating a galloping address pattern.

DESCRIPTION OF THE PREFERRED EMBODIMENTS

Now, the invention will be described in conjunction with preferred or exemplary embodiments by reference to the drawings.

Figure 1:
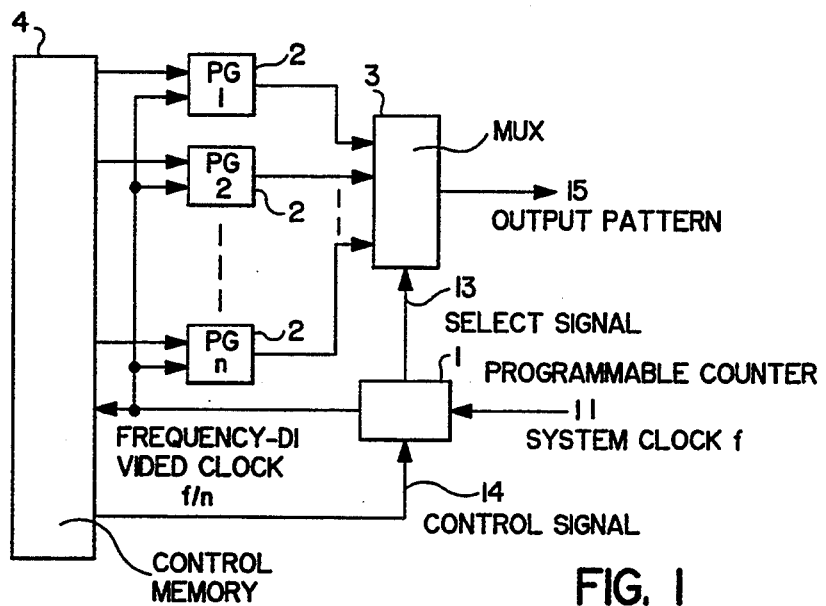
FIG. 1 is a block diagram showing an arrangement of a high-speed pattern generator according to a first embodiment of the invention.
Figure 8:
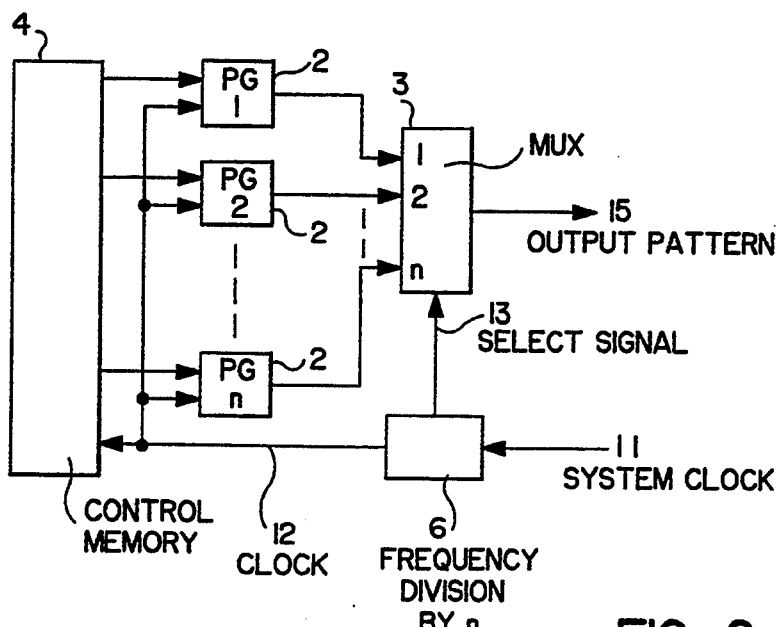
FIG. 8 shows a circuit configuration of a high-speed pattern generator known heretofore.

In FIG. 1 which shows a circuit configuration of the high-speed pattern generator according to a first embodiment of the invention, a reference numeral 1 denotes a programmable counter. Except for this programmable counter 1, other constituent parts ape same or equivalent to those shown in FIG. 8 and designated by like reference numerals. Accordingly, repeated description of these components will be unnecessary. The programmable counter 1 is supplied with a system clock signal 11 and operates to divide the frequency of the system clock signal 11 by a given frequency division ratio determined by a value supplied from the control memory 4.

Figure 2:
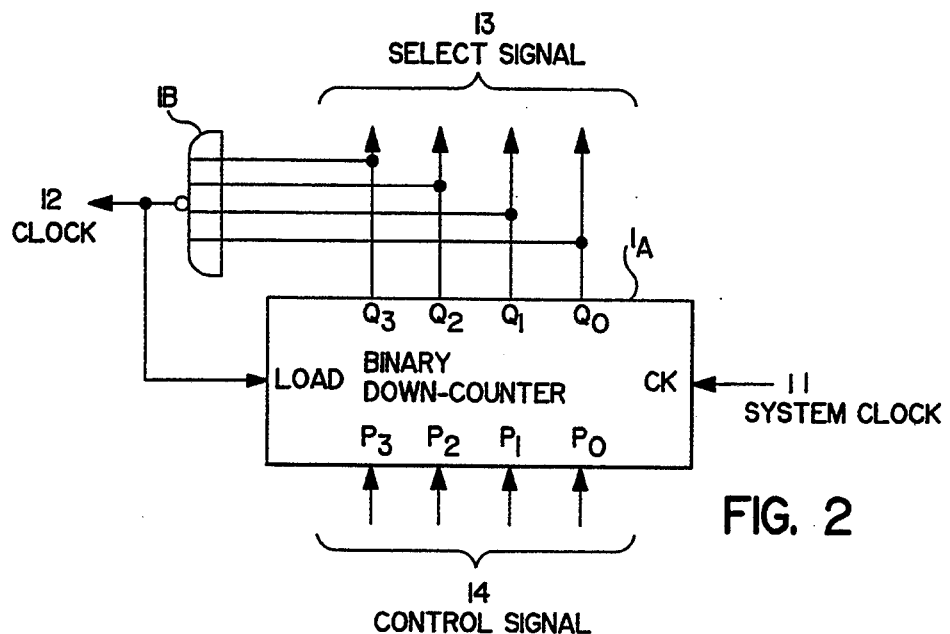
FIG. 2 is a circuit diagram for illustrating configuration and operation of a programmable counter shown in FIG. 1.

Configuration and operation of the programmable counter 1 will now be described by reference to FIG. 2. The programmable counter 1 is composed of a binary counter 1A and a zero coincidence detecting circuit 1B. The binary counter 1A has a clock input terminal CK to which the system clock signal 11 is applied, data input terminals $P_0$, $P_1$, $P_2$ and $P_3$ supplied with load data as a control signal 14 from the control memory 4 and output terminals $Q_0$, $Q_1$, $Q_2$ and $Q_3$ from which the select signal 13 is outputted to be supplied to the multiplexer 3 and to the zero coincidence detecting circuit 1B. Outputted From the zero coincidence detecting circuit 1B is a Frequency-divided clock signal 12 which is inputted to the binary counter 1A as a load signal and at the same time to the control memory 4 and the address generating circuits 2 as an operating clock signal therefor.

Figure 3:
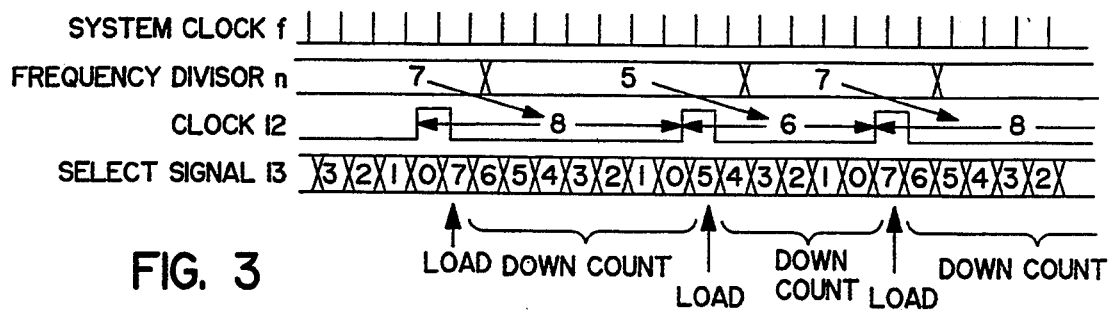
FIG. 3 is a time chart illustrating how to change a frequency division ratio on a real-time basis by using the programmable counter.

Assuming, for example, that the frequency division ratio of "8" is to be set in the programmable counter 1, the control memory 4 outputs "7" (=frequency division ratio - 1). The value "7" is loaded in the programmable counter 1 at the first clock pulse of the system clock signal 11. Subsequently, the content of the programmable counter 1 is counted down successively upon every succeeding clock pulse of the system clock signal 11. At the time point when the content of the programmable counter 1 becomes "0", the data "7" is again loaded in the programmable counter 1 at the next clock. As the frequency-divided clock signal 12 having a frequency of f/n defined hereinbefore, the zero detection signal of the programmable counter 1 is used. For the select signal 13 of the multiplexer 3, stage outputs of the binary counter 1A can be made use of straightforwardly. FIG. 3 is a time chart for illustrating operation of the pattern generator shown in FIG. 1 when the frequency division ratio is changed from "8" to "6" and then to "8" on a real-time basis.

Figure 4:
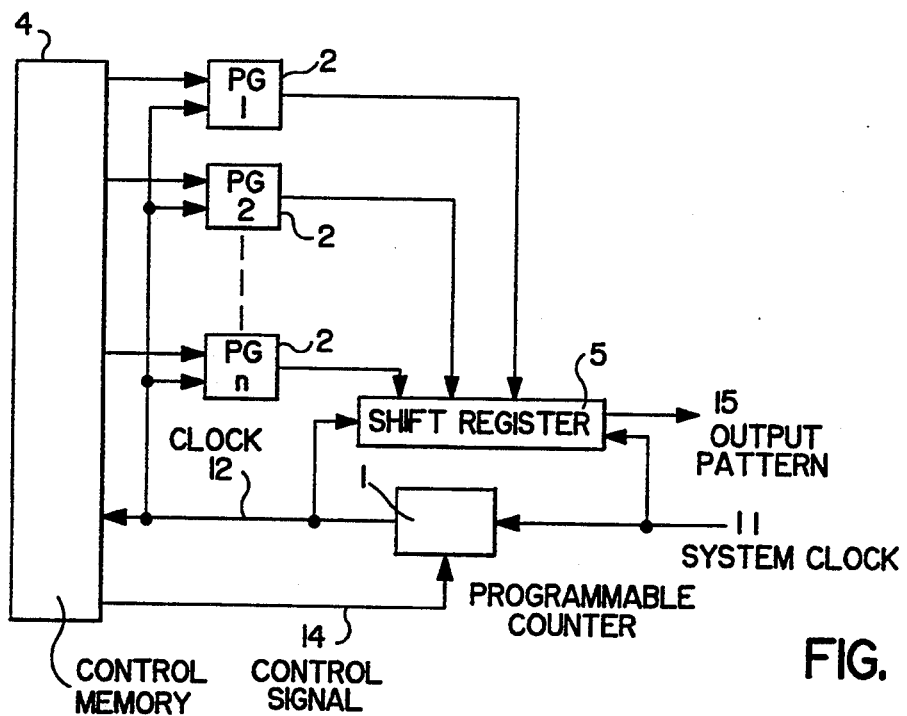
FIG. 4 is a block diagram showing an arrangement of the high-speed pattern generator according to a second embodiment of the invention.
Figure 5:
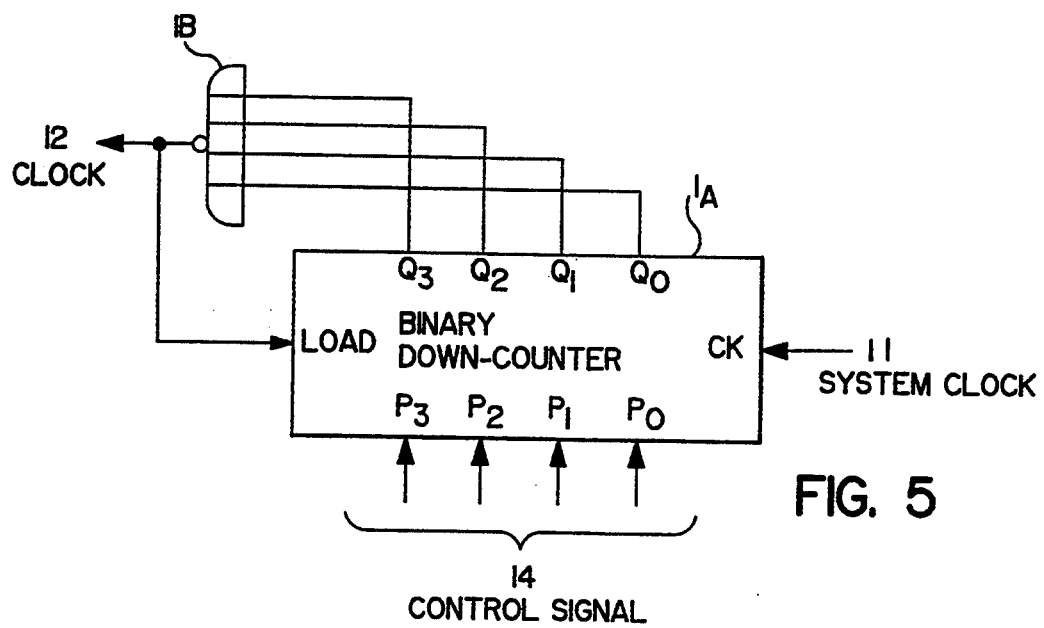
FIG. 5 is a circuit diagram showing a configuration of a programmable counter of the pattern generator shown in FIG. 4.
Figure 6:
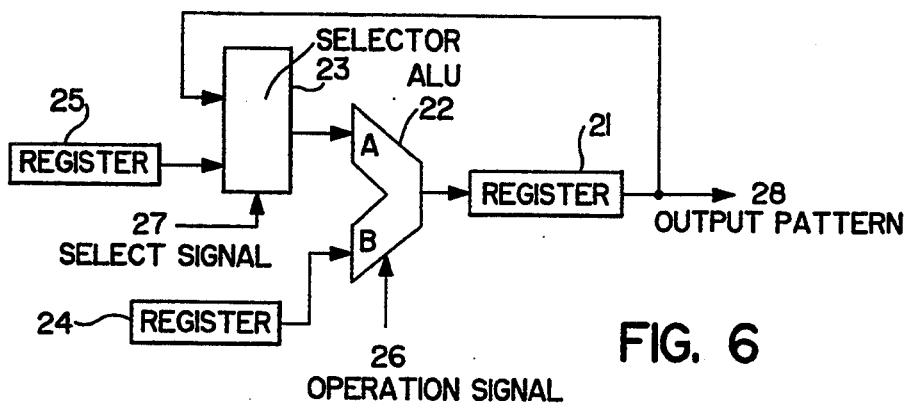
FIG. 6 is a circuit diagram showing an address pattern generating circuit known heretofore.
Figure 7:
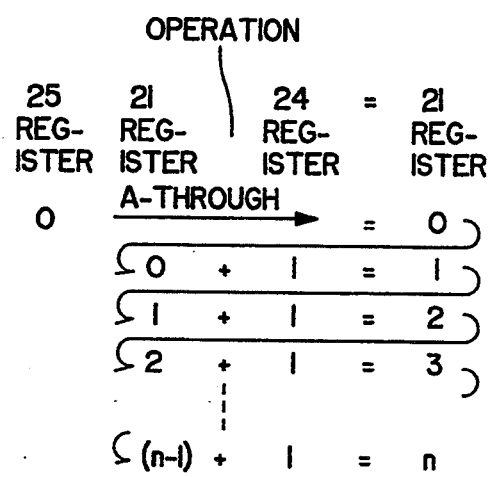
FIG. 7 is a view for illustrating an incrementing address pattern generating operation of the address generating circuit shown in FIG. 6.

FIG. 4 is a block diagram showing a second embodiment of the high-speed pattern generator according to the invention which differs from the first embodiment in that the multiplexer 3 is replaced by a shift register 5. In other respects, both embodiments share substantially same configuration. FIG. 5 shows a structure of the programmable counter 5 employed in the second embodiment. The system clock signal 11 is supplied to a shift clock input terminal of the shift register 5 in addition to the clock input terminal of the binary counter 1A. The control signal 14 outputted from the control memory 4 is supplied to the load data input of the binary counter 1A.

The outputs of the binary counter 1A are connected to the zero coincidence detecting circuit 1B, as in the case of the first embodiment. The output signal of the zero coincidence detecting circuit 1B is used as the frequency-divided clock signal 12 which is applied to the load input terminal of the binary counter 14 and additionally supplied to the control memory 4 and the pattern generating circuits 2. Further, the clock signal 12 is applied to a load input terminal of the shift register 6.

Connected to command inputs of the pattern generating circuits 2 are the outputs of the control memory 4, while the outputs of the pattern generating circuits 2 are connected to parallel data load inputs of the shift register 5, the output of which is derived as the fast pattern output 15 of the pattern generator.

As will be appreciated from the foregoing, there is provided a high-speed pattern generator free of generation of dummy pattern by virtue of changeability of the frequency division ratio on a real time basis.

While the invention has been described in terms of its preferred embodiments, it should be understood that numerous modifications may be made thereto without departing from the spirit and scope of the invention. It is intended that all such modifications fall within the scope of the invention.

I claim:

1. A high speed pattern generator, comprising:
    a programmable counter for dividing a frequency of a system clock signal by n, where n represents an integer not smaller than 2, to thereby generate a clock signal having a frequency of 1/n of the frequency of the system clock and a select signal representative of a count output of said programmable counter;
    n pattern generating circuits each operating at a frequency determined by said clock signal for producing a pattern signal as a function;
    a multiplexer for converting patterns generated by said n pattern generating circuits into a time-serial pattern in response to said select signal for sequentially selecting outputs of said n pattern generating circuits to thereby output a fast pattern; and
    a control memory which operates at a frequency determined by said clock signal for producing a control signal to periodically switch a frequency division ratio of said programmable counter between a plurality of ratios.

2. A high speed pattern generator according to claim 1, wherein said programmable counter is a binary counter having parallel inputs for setting a count of the counter and having parallel outputs, said parallel outputs constituting said select signal.

3. A high speed pattern generator according to claim 1, wherein said programmable counter is a binary counter having parallel inputs for setting a count of the counter and having parallel outputs, said parallel outputs connected to means for detecting the set count.

* * * * *